(12) United States Patent
Fujii

(10) Patent No.: US 8,588,266 B2
(45) Date of Patent: Nov. 19, 2013

(54) WAVELENGTH TUNABLE SEMICONDUCTOR LASER HAVING TWO DIFRACTIVE GRATING AREAS

(75) Inventor: Takuya Fujii, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 204 days.

(21) Appl. No.: 11/499,651

(22) Filed: Aug. 7, 2006

(65) Prior Publication Data

US 2007/0036188 A1    Feb. 15, 2007

(30) Foreign Application Priority Data

Aug. 11, 2005   (JP) .................................. 2005-232697

(51) Int. Cl.
*H01S 3/10* (2006.01)
*H01S 3/08* (2006.01)

(52) U.S. Cl.
USPC ........................... 372/50.11; 372/20; 372/102

(58) Field of Classification Search
USPC ......................................... 372/50.11, 102, 20
See application file for complete search history.

(56) References Cited

U.S. PATENT DOCUMENTS

| | | | |
|---|---|---|---|
| 4,896,325 A | | 1/1990 | Coldren |
| 5,581,572 A | * | 12/1996 | Delorme et al. ............ 372/50.11 |
| 5,699,378 A | | 12/1997 | Lealman et al. |
| 5,841,799 A | | 11/1998 | Hiroki |
| 6,317,539 B1 | | 11/2001 | Loh et al. |
| 6,432,736 B1 | | 8/2002 | Lee et al. |
| 6,590,924 B2 | | 7/2003 | Fish et al. |
| 6,782,164 B1 | | 8/2004 | Lee et al. |
| 7,130,325 B2 | | 10/2006 | Oh et al. |
| 2002/0061047 A1 | | 5/2002 | Fish et al. |
| 2002/0105991 A1 | | 8/2002 | Coldren et al. |
| 2003/0128724 A1 | | 7/2003 | Morthier |
| 2003/0147588 A1 | | 8/2003 | Pan et al. |
| 2004/0218639 A1 | | 11/2004 | Oh et al. |

FOREIGN PATENT DOCUMENTS

| | | |
|---|---|---|
| JP | 06-112570 A | 4/1994 |
| JP | 9-270568 A | 10/1997 |
| JP | 2000-510602 A | 8/2000 |
| JP | 2003-17803 A | 1/2003 |
| JP | 2004-336002 A | 11/2004 |
| WO | WO 96/24079 A | 8/1996 |
| WO | 97-14201 A1 | 4/1997 |

OTHER PUBLICATIONS

Office Action dated Mar. 28, 2008 issued in corresponding Chinese Application No. 2006 10115706.8.
European Search Report dated May 8, 2007 issued in corresponding European Patent Application No. 06 25 4145.

(Continued)

*Primary Examiner* — Jessica Stultz
*Assistant Examiner* — Marcia Golub-Miller
(74) *Attorney, Agent, or Firm* — Westerman, Hattori, Daniels & Adrian, LLP

(57) ABSTRACT

A semiconductor laser has a first diffractive grating area. The first diffractive grating area has a plurality of segments. Each segment has a first area including a diffractive grating and a second area that is space area combined to the first area. Optical lengths of at least two of the second areas are different from each other. A refractive-index of each of the segments are changeable.

8 Claims, 12 Drawing Sheets

(56) References Cited

OTHER PUBLICATIONS

Andrew J. Ward et al., "Widely Tunable DS-DBR Laser With Monolithically Integrated SOA: Design and Performance", IEEE Journal of Selected Topics in Quantum . . . , vol. 11, No. 1, Jan./Feb. 2005.

Japanese Office Action dated Jan. 5, 2010, issued in corresponding Japanese Patent Application No. 2005-232697.

European Search Report dated Nov. 18, 2010, issued in corresponding European Patent Application No. 10 17 1188.

H.C. Casey, Jr. et al., "Heterostructure Laers, Quantum Electronics—Principles and Applications", A series of Monographs, Academic Press, 1978, 6 pages.

* cited by examiner

WAVELENGTH TUNABLE SEMICONDUCTOR LASER HAVING TWO DIFRACTIVE GRATING AREAS

BACKGROUND OF THE INVENTION

1. Field of the Invention

This invention generally relates to a semiconductor laser, an optical element, a laser device, and a method of controlling the semiconductor laser.

2. Description of the Related Art

Many organizations have developed a wavelength changeable semiconductor laser having an element which can emit various wavelengths laser lights, as Wavelength Division Multiplexing (WDM) communication using an optical fiber has been spread. The wavelength changeable semiconductor lasers proposed before now are classified broadly into a semiconductor laser having a Semiconductor Optical Amplifier (SOA) in an external resonator thereof and controlling an emitting wavelength with a wavelength selecting mechanism in the external resonator and a semiconductor laser having a structure in which a resonator acting as a wavelength selectable portion is built in a semiconductor element amplifying a laser light.

A laser having a Sampled Grating Distributed Reflector (SG-DR) waveguide is disclosed as a typical wavelength changeable semiconductor laser, in which the resonator is built in the semiconductor element, in Japanese Patent Application Publication No. 9-270568 (hereinafter referred to as Document 1), Japanese Patent Application Publication No. 2004-336002 (hereinafter referred to as Document 2), Japanese Patent Application Publication No. 2003-17803 (hereinafter referred to as Document 3), U.S. Pat. No. 6,432,736 (hereinafter referred to as Document 4), U.S. Patent Application Publication No. 2003/0128724 (hereinafter referred to as Document 5), U.S. Patent Application Publication No. 2002/0105991 (hereinafter referred to as Document 6), U.S. Patent Application Publication No. 2002/0061047 (hereinafter referred to as Document 7), U.S. Pat. No. 6,590,924 (hereinafter referred to as Document 8), U.S. Pat. No. 6,317,539 (hereinafter referred to as Document 9), U.S. Pat. No. 4,896,325 (hereinafter referred to as Document 10), and Proc. IEEE, Selected Topics in Quantum Electronics, IEEE Journal of, Vol. 11, Issue 1, 2005 (hereinafter referred to as Document 11). The laser disclosed in Document 8 uses a vernier effect. The laser has a structure in which SG-DR waveguides having different optical longitudinal mode interval from each other are respectively connected to both ends of a waveguide amplifying a laser light. The laser changes a reflection peak wavelength of optical longitudinal modes of one of the SG-DR wavelengths and a reflection peak wavelength of optical longitudinal modes of the other by changing temperature, current and so on, and emits a laser at a wavelength where the peak wavelengths corresponds to each other.

The laser disclosed in Document 1 has a structure in which a SG-DR waveguide is combined to a Fabry-Perot (FP) resonator amplifying a laser light, changes reflection peak wavelengths of optical longitudinal mode of the FP resonator and the SG-DR waveguide by changing such as temperature or current, and emits a laser at a wavelength where the peak wavelengths correspond to each other.

Both of the lasers disclosed in Document 1 and Document 8 emit a laser based on a same principle using the vernier effect by the semiconductor waveguide. The laser disclosed in Document 1 has an advantage relative to that disclosed in Document 8, because an element length of the laser disclosed in Document 1 is smaller than that of the laser disclosed in Document 8. However, it is difficult that the laser in Document 1 emits a stable laser, because the Q value of reflection spectrum of the simple FP resonator is small. And a structure, in which a SG-DR waveguide is combined to a Sampled Grating Distributed Feedback (SG-DFB) laser having a SG-DR waveguide core as a gain medium has been proposed in Document 2.

The SG-DR waveguide has segments combined to each other, in which an area having a diffractive grating and an area not having a diffractive grating are combined to each other. The lengths of the segments in the conventional SG-DR wavelength are substantially equal to each other. When a wavelength is changed, the refraction index of each segment of the SG-DR waveguide is controlled in a same condition.

However, a conventional wavelength changeable laser having a SG-DR waveguide tends to emit lasers besides a desirable laser, when the range where wavelength is changeable is spread. There is, therefore, a problem that the mode stability of the laser emission is degraded. A description will be given of the reason with reference to reflection spectrums of two SG-DR waveguides having different optical longitudinal mode interval from each other.

It is necessary to match one of the optical longitudinal mode wavelengths of a SG-DR waveguide and one of the optical longitudinal mode wavelength of another SG-DR waveguide with a desirable wavelength or to match one of the optical longitudinal mode wavelengths of a SG-DR waveguide and one of the optical longitudinal mode wavelengths of a SG-DFB waveguide with the desirable wavelength. The optical longitudinal mode wavelengths of the SG-DR waveguide change when the refraction index of the SG-DR waveguide is changed. It is possible to change the refraction index by changing such as a current provided to the SG-DR waveguide or temperature of the SG-DR waveguide. For example, it is necessary to control the temperature of the SG-DR waveguide in a range of approximately 15 degrees C in order to match the optical longitudinal mode with a desirable wavelength with an element temperature, when the interval of the optical longitudinal modes of the SG-DR waveguide is approximately 200 GHz. A usual mechanism can achieve the temperature range.

FIG. 11 illustrates a calculation example of reflection spectrums of two SG-DR waveguides when the intervals of the optical longitudinal modes of the two SG-DR waveguides are respectively 194 GHz and 170 GHz. In this example, the temperatures of the two SG-DR waveguides are controlled so that the optical longitudinal modes of both SG-DR waveguides correspond at 194000 GHz. The horizontal axis of FIG. 11 indicates frequency. The vertical axis of FIG. 11 indicates a reflectivity of the SG-DR waveguides measured by dB. A laser emission is obtained at 194000 GHz, because both optical longitudinal modes of the SG-DR waveguides correspond to each other at 194000 GHz. However, the peak frequencies of both of the optical longitudinal modes discord to each other as the frequency gets away from 194000 GHz, because the intervals of the optical longitudinal modes are different from each other. No laser is emitted at other optical longitudinal mode frequencies around 194000 GHz. This is the vernier effect.

The peak reflections of the optical longitudinal modes of both of SG-DR waveguides correspond to each other approximately at 195400 GHz and 192600 GHz away from 194000 GHz by 1400 GHz. Lasers intend to be emitted at these two frequencies. Accordingly, the mode stability of a laser emission desired at 194000 GHz is degraded.

FIG. 12 illustrates an emission spectrum at threshold of laser emission calculated by a computer simulation for threshold by using the wavelength changeable semiconductor laser having two SG-DR waveguides shown in FIG. 11. The horizontal axis of FIG. 12 indicates frequency. The vertical axis of FIG. 12 indicates light intensity. As shown in FIG. 12, lasers are emitted at 195600 GHz.

It is necessary to reduce the difference between the optical longitudinal mode intervals of the two SG-DR waveguides so that the frequency where the reflection peaks correspond is out of the wavelength changeable range, and to structure a waveguide core having a gain getting smaller in a range out of the wavelength changeable range, in order to restrain the mode degradation caused by the mechanism. The wavelength changeable range is, for example, approximately from 192000 GHz through to 196000 GHz.

Next, a description will be given of a calculation example in a case where optical longitudinal mode intervals of the two SG-DR wavelengths are set respectively at 194 GHz and at 184 GHz and the difference between the intervals is 10 GHz. In this case, there is no correspondence between the reflection peaks in the range from 192000 GHz through to 196000 GHz besides at 194000 GHz. However, the difference between the optical longitudinal mode peak frequencies of the two SG-DR wavelengths is reduced at the optical longitudinal mode next to 194000 GHz. Accordingly, there is a problem that a laser tends to be emitted at the optical longitudinal mode next to the desirable frequency.

As mentioned above, there is a problem that an emission tends to occur at frequencies besides a desirable one and the mode stability of a laser emission is degraded in a conventional art, in a case where an element is structured so as to change a laser wavelength in a broad range.

A case where two SG-DR wavelengths are used is mentioned above. The same phenomenon occurs in a semiconductor laser in which a FP waveguide and a SG-DR waveguide are combined or a SG-DR waveguide and a SG-DFB waveguide are combined. As shown in FIG. 11, a whole point of the mode degradation in a conventional art is that the semiconductor has a little wavelength dependence of an optical longitudinal mode peak reflectivity of a reflection spectrum. That is, it is very difficult to restrain the mode degradation of a laser emission of a wavelength changeable laser having a SG-DR waveguide of the conventional art and being capable of changing a wavelength in a broad range.

An art to solve the problem, in which pitches of sampled diffractive gratings change from one end to the other end, is disclosed in Document 3. It is possible to enhance the reflectivity of an optical longitudinal mode around a given wavelength in the arrangement. However, it is necessary to use an advanced exposure technology using electron beam lithography in order to structure the diffractive gratings. In addition, it is very difficult to stabilize the phase relation between the sampled diffractive gratings of segments. There is a problem that interference effect of the reflected light from each segment is reduced.

The method of enhancing a reflectivity at a wavelength around a given wavelength by using a diffractive grating having various pitches is known, as mentioned in Document 11. However, the diffractive grating has no clear optical longitudinal modes like those of SG-DR waveguide. Therefore, there is a problem that it is difficult to restrain an emission of the FP waveguide, the SG-DR waveguide or the SG-DFB waveguide combined to the SG-DR wavelength at an optical longitudinal mode next to the desirable mode

SUMMARY OF THE INVENTION

The present invention provides a semiconductor laser having a newly structured SG-DR waveguide and can stabilize the laser emission mode.

According to an aspect of the present invention, preferably, there is provided a semiconductor laser including a first diffractive grating area. The first diffractive grating area has a plurality of segments. Each segment has a first area including a diffractive grating and a second area that is space area combined to the first area. Optical lengths of at least two of the second areas are different from each other. A refractive-index of each segments are changeable.

With the above-mentioned configuration, peak reflection intensity of the optical longitudinal mode of the first diffractive grating area has wavelength dependence, because the optical lengths of at least two of the second areas are different from each other. In this case, the peak reflectivity of the optical longitudinal mode of the first diffractive grating area indicates relatively high in a given wavelength range. And it is possible to restrain a laser emission in a wavelength range where the peak reflectivity of the optical longitudinal mode of the first diffractive grating area is relatively low. And it is possible to obtain a stabilized laser emission in the range where the peak reflectivity of the optical longitudinal mode of the first diffractive grating area indicates relatively high. In addition, it is possible to change the laser emission wavelength easily, because the refractive-index of each of the segments are changeable.

According to another aspect of the present invention, preferably, there is provided a method of controlling a semiconductor laser. The method includes a step of controlling peak wavelengths of optical longitudinal modes of a first diffractive grating area and intensities of the optical longitudinal modes by controlling refractive-indexes of at least two segments to be different from each other. The semiconductor laser has the first diffractive grating area having a plurality of segments. Each segment has a first area that includes a diffractive grating and a second area that is space area combined to the first area. Optical lengths of at least two of the second areas are different from each other. The refractive-index of each of the segments is changeable.

With the above-mentioned configuration, the refractive-indexes of at least two segments are controlled to be different from each other. And the peak wavelengths of the optical longitudinal modes of the first diffractive grating area and the intensities of the optical longitudinal modes are controlled. In this case, it is possible to restrain a laser emission in a wavelength range where the peak reflectivity of the optical longitudinal mode of the first diffractive grating area is relatively low. And it is possible to obtain a stabilized laser emission in the range where the peak reflectivity of the optical longitudinal mode of the first diffractive grating area indicates relatively high. It is thus possible to stabilize the mode of the laser emission.

According to another aspect of the present invention, preferably, there is provided an optical element having a first diffractive gratin area. The first diffractive grating area has a plurality of segments. Each segment has a first area including a diffractive grating and a second area that is space area combined to the first area. Optical lengths of at least two of the second areas are different from each other. The refractive-index of each of the segments are changeable.

With the above-mentioned configuration, peak reflection intensity of the optical longitudinal mode of the first diffractive grating area has wavelength dependence, because the optical lengths of at least two of the second areas are different from each other. In this case, the peak reflectivity of the optical longitudinal mode of the first diffractive grating area indicates relatively high in a given wavelength range. And it is possible to restrain a laser emission in a wavelength range where the peak reflectivity of the optical longitudinal mode of the first diffractive grating area is relatively low. And it is possible to obtain a stabilized laser emission in the range where the peak reflectivity of the optical longitudinal mode of the first diffractive grating area indicates relatively high. In addition, it is possible to change the laser emission wavelength easily, because the refractive-index of each of the segments are changeable.

According to another aspect of the present invention, preferably, there is provided a laser device having a first optical element and an optical amplifier. The first optical element has a first diffractive grating area. The diffractive grating area has a plurality of segments. Each segment has a first area including a diffractive grating and a second area that is space area combined to the first area. Optical lengths of at least two of the second areas are different from each other. The refractive-index of each of the segments are changeable.

With the above-mentioned configuration, a laser light is generated in the optical amplifier. And the light is provided in the first optical element. Peak reflection intensity of the optical longitudinal mode of the first diffractive grating area has wavelength dependence, because the optical lengths of at least two of the second areas are different from each other. In this case, the peak reflectivity of the optical longitudinal mode of the first diffractive grating area indicates relatively high in a given wavelength range. And it is possible to restrain a laser emission in a wavelength range where the peak reflectivity of the optical longitudinal mode of the first diffractive grating area is relatively low. And it is possible to obtain a stabilized laser emission in the range where the peak reflectivity of the optical longitudinal mode of the first diffractive grating area indicates relatively high. In addition, it is possible to change the laser emission wavelength easily, because the refractive-index of each of the segments are changeable.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
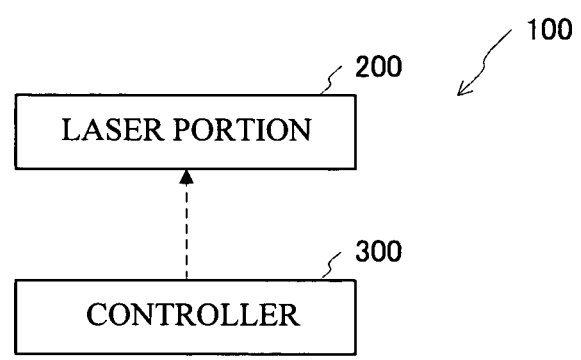
FIG. 1 illustrates a block diagram of a laser device in accordance with a first embodiment of the present invention.

FIG. 1 illustrates a block diagram of a laser device 100 in accordance with a first embodiment of the present invention. The laser device 100 has a laser portion 200 and a controller 300, as shown in FIG. 1. The controller 300 has a central processing unit (CPU), a read only memory (ROM) and so on. The controller 300 stores a control information, a control program and so on of the laser portion 200. The controller 300 controls a laser emission wavelength of the laser portion 200 by controlling an electrical signal such as a current to be provided to the laser portion 200.

Figure 2A:
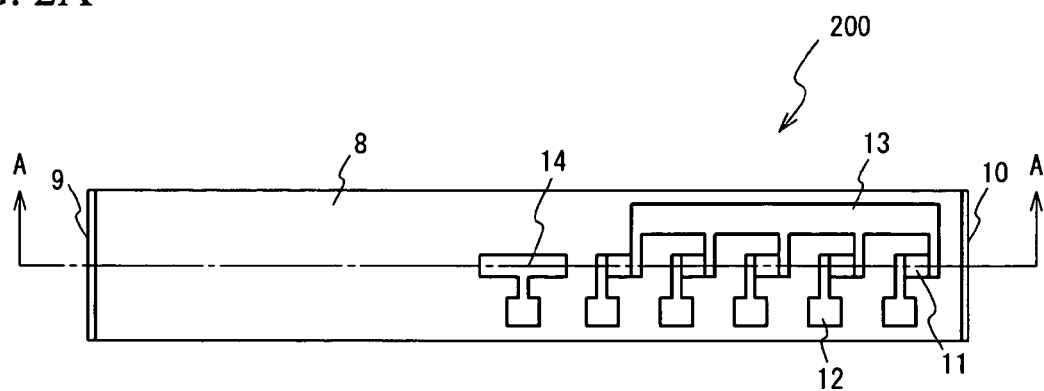
FIG. 2A and FIG. 2B illustrate a detail of the laser portion.
Figure 2B:
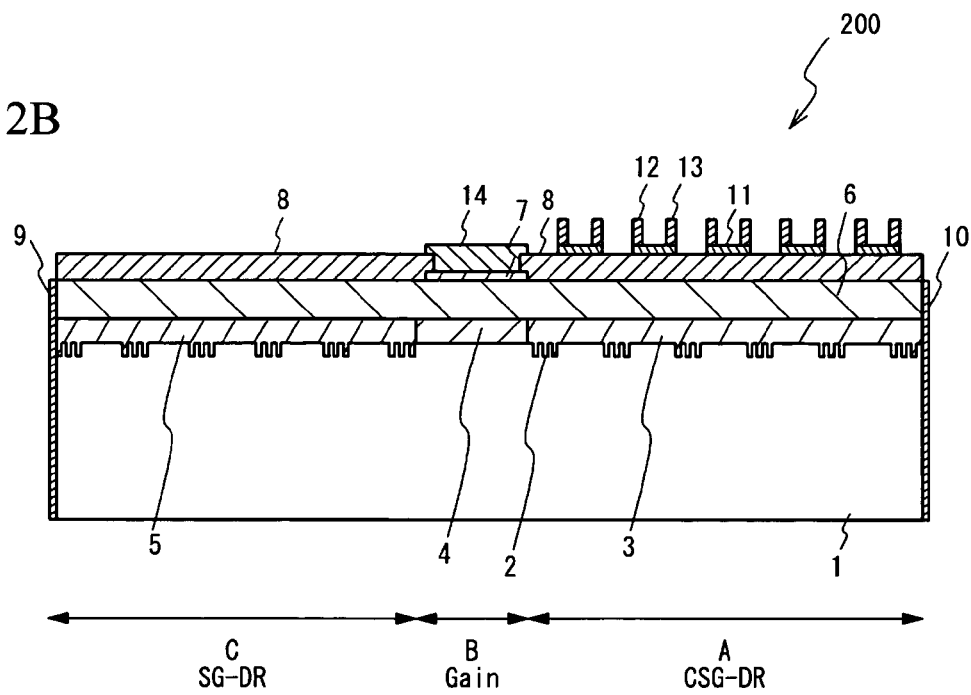

FIG. 2A and FIG. 2B illustrate a detail of the laser portion 200. FIG. 2A illustrates a top view of the laser portion 200. FIG. 2B illustrates a cross sectional view taken along a line A-A of FIG. 2A. A description will be given, with reference to FIG. 2A and FIG. 2B, of the laser portion 200. As shown in FIG. 2A and FIG. 2B, the laser portion 200 has a structure in which a Chirped Sampled Grating Distributed Reflector (CSG-DR) area A, a Gain area B and a SG-DR area B are coupled in order.

The CSG-DR area A has a structure in which a waveguide core 3, a cladding layer 6 and an insulating layer 8 are laminated on a substrate 1 in order and thin film resistors 11, power electrodes 12 and a ground electrode 13 are laminated on the insulating layer 8. The gain area B has a structure in which a waveguide core 4, the cladding layer 6, a contact layer 7 and an electrode 14 are laminated on the substrate 1 in order. The SG-DR area C has a structure in which a waveguide core 5, the cladding layer 6 and the insulating layer 8 are laminated on the substrate 1 in order.

The substrate 1 and the cladding layer 6 of the CSG-DR area A, the Gain area B and the SG-DR area C are formed as a unit respectively. The waveguides cores 3 through 5 are formed on a same plane and form a waveguide core together. A low reflecting coating 9 is formed on end faces of the substrate 1, the waveguide core 5 and the cladding layer 6 at the SG-DR area C side. On the other hand, a low reflecting coating 10 is formed on end faces of the substrate 1, the waveguide core 3 and the cladding layer 6 at the CSG-DR area A side. Sampled diffractive gratings 2 are formed at given intervals in the waveguide cores 3 and 5. The sampled grating is thus formed.

The substrate 1 is, for example, a crystalline substrate composed of InP. The waveguide cores 3 and 5 are, for example, composed of InGaAsP crystalline having an absorption edge wavelength at shorter wavelengths side relative to the laser emission wavelength. PL wavelength of the waveguide cores 3 and 5 is approximately 1.3 μm. The waveguide core 4 is, for example, composed of InGaAsP crystalline amplifying a light of a desirable wavelength of a laser emission. The PL wavelength of the waveguide core 4 is approximately 1.57 μm.

The coupling constant of the sampled diffractive grating 2 is approximately 200 $cm^{-1}$. The pitch of the sampled diffractive gratings is approximately 0.24 μm. The number of asperity of the sampled diffractive gratins 2 is approximately 17. The length of the sampled diffractive grating 2 is approximately 4 μm. The bragg wavelength of the sampled diffractive grating 2 is approximately 1.55 μm. In this case, the reflectivity against the bragg wavelength of the sampled diffractive grating 2 is approximately 1%.

Five segments are formed in the waveguide core 3. Hereinafter, the segment is an area in which one area having the sampled diffractive grating 2 and one space area not having the sampled diffractive grating 2 are combined in a waveguide core. In general, it is possible to enhance an interference effect of light reflected by a sampled diffractive grating, when the number of the segments is increased. And a mode stability of a laser emission is thus improved. However, element length is increased if the number of the segments is increased. In addition, the mode stability is saturated because of an internal loss in the waveguide core 3, when total length of the waveguide core 3 is over 2 mm. It is, therefore, preferable that the number of the segments in the waveguide core 3 is approximately 5.

It is possible to change an optical longitudinal mode wavelength of a waveguide core easily, when the length of each segment is increased and the optical longitudinal mode spacing is reduced. In this case, however, the length of the waveguide core is increased. On the contrary, lengths of the segments in the waveguide core 3 are, for example, 260 μm, 265 μm, 270 μm, 275 μm and 280 μm in order from the Gain area B side, in the embodiment. The optical longitudinal mode spacings of the segments in this case are 176 GHz, 173 GHz, 170 GHz, 167 GHz and 164 GHz.

In the embodiment, the length of each segment changes dependent on the length of the space area. The segments mentioned above are arranged in an opposite direction. It is not necessary that all of the lengths of the segments are different from each other. The length difference between the segments may differ. However, the configuration of the embodiment has an advantage in control viewpoint as mentioned later, because change amounts of refractive-index for wavelength control of the segments next to each other is constant in the embodiment.

The number of the segments in the waveguide core 5 is preferably as same as that of the waveguide core 3, and is, for example, 5. Each length of the segments in the waveguide core 5 is substantially equal to each other, and is, for example, 240 μm. "Substantially equal" means that differences between each of the space areas are lower than 1% of the average length of the space areas.

It is possible to form the SG-DR structure of the SG-DR area C by an art using a method such as an interference exposure method and a partial exposure method. At first, a diffractive grating pattern is formed on whole area of a resist coated on the substrate 1 by the interference exposure method. Next, a pattern of the space areas to divide the diffractive grating pattern on the substrate 1 are formed by the partial exposure method with an exposure mask having an opening and shielding a light partially. When the resist is developed after the double exposure, the structure of the sampled diffractive grating 2 is formed. The sampled diffractive grating 2 in accordance with the embodiment, in which phase relationships between each diffractive grating are determined, is formed when the resist pattern is printed on the substrate 1.

It is possible to form the CSG-DR structure of the CSG-DR area A, when a pattern that can change the length of an area not having the sampled diffractive grating 2 is used as an exposure mask for use of the partial exposure method mentioned above. In addition, it is possible to form the CSG-DR area A and the SG-DR area C in a same process if the exposure method is used. It is thus possible to shorten and simplify the manufacturing process. The manufacturing cost is, therefore, reduced.

The cladding layer 6 is composed of InP, constricts a current and confines a laser light traveling in the waveguide cores 3, 4 and 5. The contact layer 7 is composed of InGaAsP crystalline. The insulating layer 8 is a protection film composed of such as SiN or $SiO_2$. The low reflecting coatings 9 and 10 are, for example, composed of a dielectric film including $MgF_2$ and TiON. The reflectivity of the low reflecting coatings 9 and 10 is, for example, lower than 0.3%.

The thin film resistors 11 are composed of such as NiCr, and control the temperature of the segments in the waveguide core 3 based on the current intensity provided from the controller 300 in FIG. 1. Each of the thin film resistors 11 is formed on the insulating layer 8 above each of the segments in the waveguide core 3. Each of the power electrodes 12 is connected to each of the thin film resistors 11. The ground electrode 13 is connected to the thin film resistors 11. The power electrodes 12, the ground electrode 13 and the electrode 14 are composed of a conductive material such as Au.

Next, a description will be given of an operation of the laser portion 200. At first, a given current is provided to the electrode 14 from the controller 300 in FIG. 1. And a light is generated in the waveguide core 4. The light propagates in the waveguide cores 3, 4 and 5, is reflected and amplified repeatedly, and is emitted toward outside.

Figure 3:
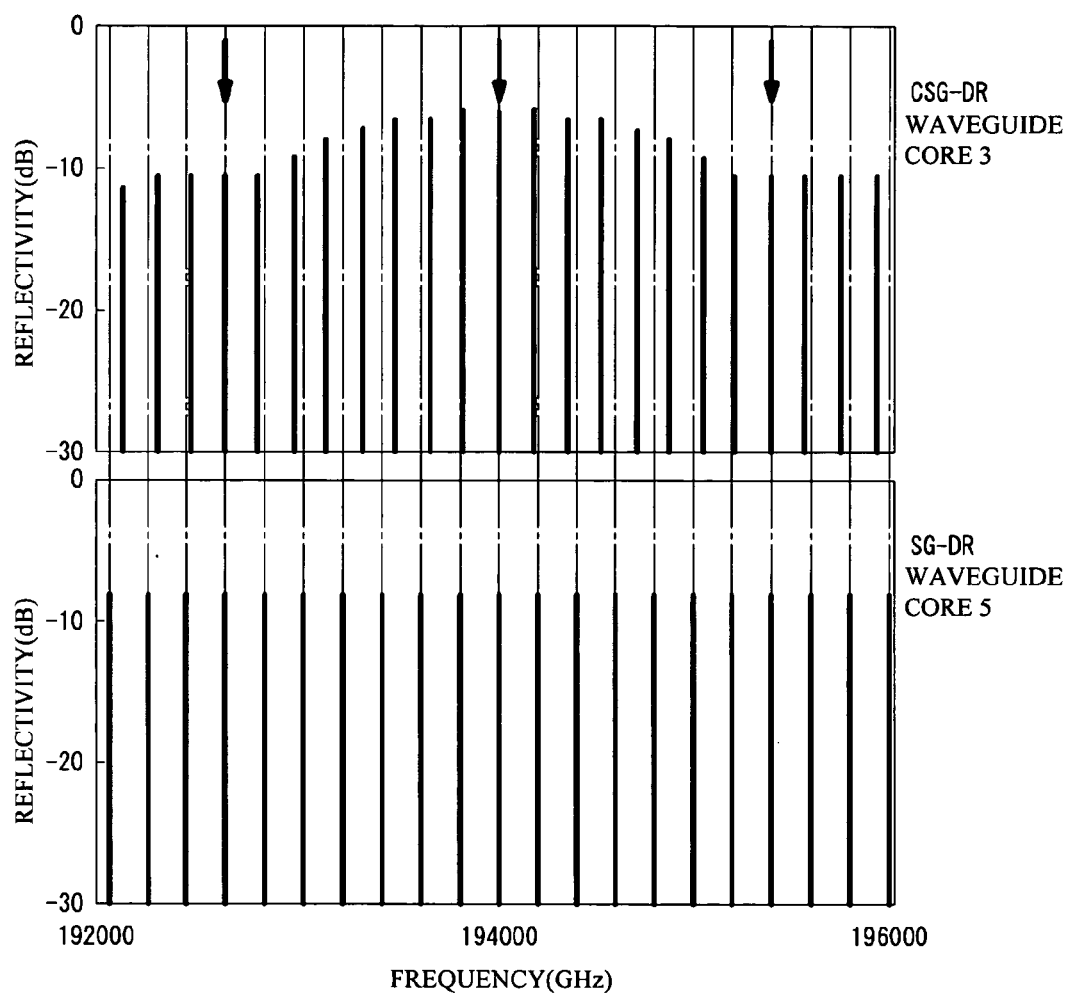
FIG. 3 illustrates a calculation example of reflection spectrums of the waveguide core.

FIG. 3 illustrates a calculation example of reflection spectrums of the waveguide core 3 and reflection spectrums of the waveguide core 5. A horizontal axis of FIG. 3 indicates frequency. A vertical axis of FIG. 3 indicates reflectivity. The calculation example is simplified in FIG. 3. As shown in the upper figure in FIG. 3, the peak reflectivity of the waveguide core 3 indicates relatively high around 194000 GHz, and indicates a local maximum value at 194000 GHz. It is because the phase of the light traveling among the segments in the waveguide core is a value of integral multiplication of $2\pi$ at 194000 GHz.

On the other hand, the peak reflectivity of the waveguide core 3 is reduced when the frequency of the peak reflectivity is as far from 194000 GHz. It is because phase-matched superposition does not occur, as the optical longitudinal mode spacings of the segments are slightly different from each other. In the embodiment, a difference between the local maximum value of the peak reflectivity and the local minimum value of the peak reflectivity is approximately 5 dB. In addition, as shown in lower figure in FIG. 3, the peak reflectivity indicates a constant value at any optical longitudinal modes.

The optical longitudinal mode of the waveguide core 3 corresponds to the optical longitudinal mode of the waveguide core 5 at 195400 GHz and at 192600 GHz besides at 194000 GHz. However, the reflectivity of the waveguide core 3 at 195400 GHz and at 192600 GHz is small enough relative to that at 194000 GHz. The occurrence possibility of laser emission at 195400 GHz and at 192600 GHz is, therefore, small.

The peak reflection intensity of the optical longitudinal mode of the waveguide core 3 has wavelength dependence in the laser portion 200 in accordance with the embodiment. That is, the peak reflection intensity of the optical longitudinal mode of the waveguide core 3 changes based on the wavelength. On the contrary, the peak reflection intensity of the waveguide core 5 does not have wavelength dependence. It is possible to restrain a laser emission within a wavelength range in which the peak reflection intensity of the optical longitudinal mode of the waveguide core 3 is relatively low, and to obtain a stabilized laser emission within a wavelength range in which the peak reflection intensity of the optical longitudinal mode of the waveguide core 3 is relatively high. In addition, it is possible to control the laser emission wavelength easily, when the wavelength range in which the peak reflection intensity of the optical longitudinal mode is relatively high is changed with the change of the refractive-index of the waveguide core 3. There is no affection to the waveguide light, although there are provided diffractive gratings at both end faces of the waveguide cores 3 and 5 in accordance with the embodiment.

Figure 4:
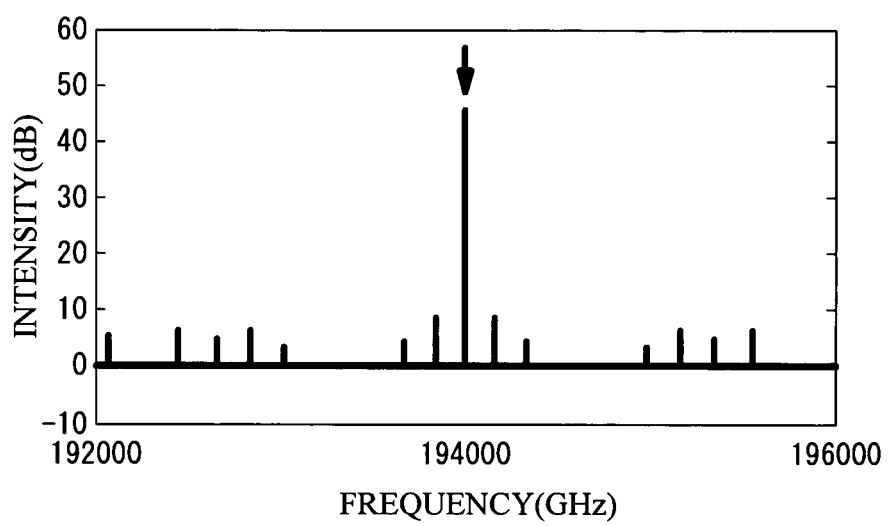
FIG. 4 illustrates an emission spectrum at threshold of laser emission calculated by a computer simulation for threshold gain.

FIG. 4 illustrates an emission spectrum at threshold of laser emission calculated by a computer simulation for threshold gain. The horizontal axis of FIG. 4 indicates frequency. The vertical axis of FIG. 4 indicates light intensity. In the analysis, the reflectivity at the end face is assumed 0%. In the calculation example, the optical longitudinal mode easy to be emitted next to the desirable optical longitudinal mode at 194000 GHz is the next optical longitudinal mode at lower frequency side. However, a difference between each of the threshold gains is 4 cm$^{-1}$. In this case, it is possible to obtain a stabilized laser emission. As mentioned above, the stabilized single mode laser emission is obtained, in the embodiment.

In the embodiment, the lengths of the segments increase by 5 μm from 260 μm to 280 μm. The result of the computer simulation for threshold gain shows that the mode stability is degraded particularly when the minimum difference between each of the lengths of the segments in the waveguide core 3 whose lengths are different from each other is out of the range 1% to 6% of the average length of the space areas.

A description will be qualitatively given of the mechanism of the degradation of the mode stability. When the minimum difference is lower than 1% of the average length of the space areas, the reflection spectrum is closer to that of a conventional SG-DR waveguide. That is, the occurrence possibility of a laser emission at an optical longitudinal wavelength far from the desirable wavelength is high. In contrast, when the minimum difference is higher than 6% of the average length of the space areas, another wavelength of the local maximum of the peak reflectivity is within the wavelength range in which the laser emission wavelength moves. That is, the occurrence possibility of the laser emission at frequencies of the desirable wavelength and another wavelength whose reflectivity is local maximum is high. Accordingly, the mode stability is degraded seriously. It is, therefore, preferable that the minimum difference between each of the lengths of the segments in the waveguide core 3 whose lengths are different from each other is within the range 1% to 6% of the average length of the space areas.

The differences between each of the segments in the waveguide core 3 may be different from each other, although the differences are equal to each other in the embodiment. The control of the laser emission wavelength is complicated when the differences are not equal, because the change amount of refractive-index necessary for the wavelength change is complicated. Accordingly, it is advantageous in a control algorithm viewpoint that minimum values between the differences between each of the lengths of the segments and the minimum differences between each of the lengths of the segments other than those having a same length are equal. It is because the change amount of the refractive-index of the segments is integral multiplication of a given unit change amount, when the differences are equal.

In addition, it is advantageous in the same viewpoint that differences between the lengths of the segments next to each other are equal and the segments are combined in descending order or in ascending order of length. It is because that it is possible to change the wavelength of the local maximum peak reflectivity when refractive-indexes of the segments are changed at a fixed gradient.

It is possible to control the local maximum peak reflectivity of the waveguide core 3 mentioned above by controlling the refractive-index of the segments in the waveguide core 3 from outside. A description will be given of a controlling method of the local maximum peak reflectivity of the waveguide core 3. At first, a given current is provided to each of the thin film resistors 11 through each of the power electrodes 12 from the controller 300. The temperature of each segment in the waveguide core 3 changes to a given value. The refractive-index of the waveguide core 3 changes to a given value. The current passing through the thin film resistors 11 is recovered through the ground electrode 13.

In the embodiment, the waveguide core 3 has an equivalent refractive-index so that the peak reflectivity indicates local maximum at 194000 GHz when there is no temperature gradient. The equivalent refractive-index of the waveguide core 3 is 3.2086 in this case. In addition, the equivalent refractive-index of the waveguide core 3 changes by approximately 0.0002 for every 1 degree C.

Figure 5:
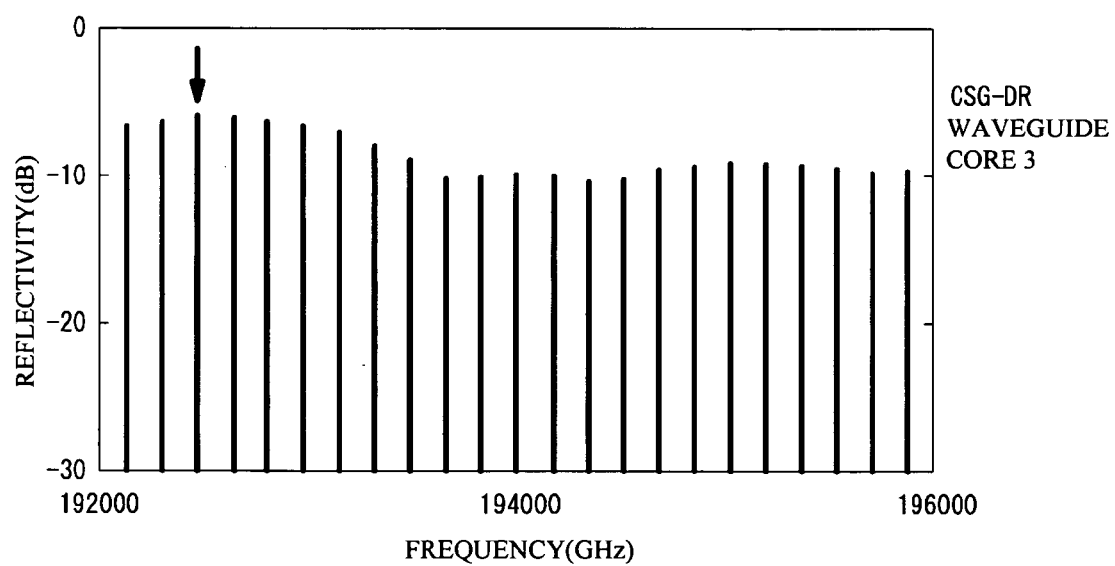
FIG. 5 illustrates reflection spectrums of the waveguide core in a case where the temperatures of the segments are controlled so as to be lower as the length of the segment is smaller and where the temperature difference between the segments next to each other in the waveguide core is 2 degrees C.

FIG. 5 illustrates reflection spectrums of the waveguide core 3 in a case where the temperatures of the segments are controlled so as to be lower as the length of the segment is smaller and where the temperature difference between the segments next to each other in the waveguide core 3 is 2 degrees C. The horizontal axis of FIG. 5 indicates frequency. The vertical axis of FIG. 5 indicates reflectivity.

As shown in FIG. 5, the frequency of the local maximum peak reflectivity of the waveguide core 3 is 192500 GHz in a case where the difference between each of the temperatures of the segments in the waveguide core 3. It is possible to shift the frequency of the local maximum peak reflectivity by −1500 GHz, when the difference between each of the segments is set 2 degrees C. In contrast, it is possible to shift the frequency of the local maximum peak reflectivity by 1500 GHz, when the difference between each of the segments is set −2 degrees C. As mentioned above, it is possible to change the local maximum of the peak reflectivity by changing the differences between each of the segments. The light intensity of each optical longitudinal mode changes based on the temperature gradient but the frequencies of those do not change.

Figure 6:
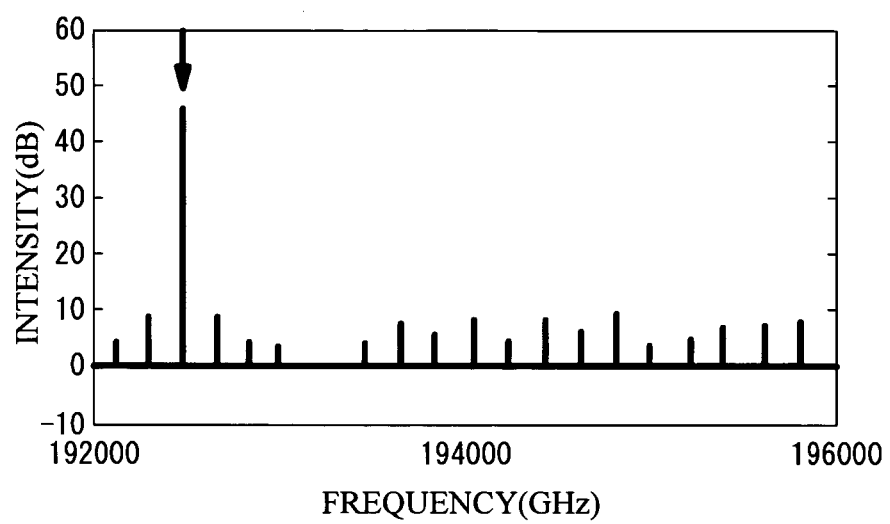
FIG. 6 illustrates emission spectrums at threshold of laser emission calculated by a computer simulation for threshold gain in a case of FIG. 5.

FIG. 6 illustrates emission spectrums at threshold of laser emission calculated by a computer simulation for threshold gain in a case of FIG. 5. The horizontal axis of FIG. 6 indicates frequency. The vertical axis of FIG. 6 indicates light intensity. In the analysis, the reflectivity at the end face is assumed 0%. As shown in FIG. 6, the stabilized single mode laser emission is obtained at 192500 GHz, a frequency of the desirable laser emission.

It is necessary to adjust the frequencies of the optical longitudinal modes by controlling the temperature of the waveguide core 5 and the average temperature of the waveguide core 3 as well as the temperature gradient in order to set the local maximum frequency of the reflection peak of the optical longitudinal mode to a desirable value. It is, therefore, necessary to control the wavelengths by controlling the temperature of the waveguide core 5 and the average temperature and the temperature gradient of the waveguide core 3, when the differences between the segments next to each other are equal and the segments are combined in descending order or in ascending order of length. However, a constant feedback control during the laser emission is not necessary, because the temperature gradient of the waveguide core 3 does not change the frequency of the optical longitudinal mode. In addition, parameters to be controlled during the constant feedback control are only the temperature of the waveguide core 5 and the average temperature of the waveguide core 3 at a maximum. The arrangement in accordance with the embodiment is, therefore, advantageous in the control algorithm viewpoint.

It is usual that the laser portion 200 is operated with entire part thereof being arranged on a temperature control device. The average temperature of the waveguide core 3 changes when the temperature of the waveguide core 5 is changed by the temperature control device. This does not cause a problem, however. It is because that the changing of the wavelengths is possible when the difference between the temperature of the waveguide core 5 and the average temperature of the waveguide core 3 are controlled. In particular, the changing of the wavelengths is achieved easily when the length differences between each of the segments next to each other are equal and the segments are combined in descending order or in ascending order of length. In this case, it is possible to keep the stable laser emission because the temperature differences are difficult to be disturbed by the temperature change of outside.

It is possible to control the refractive-index of each segment in the waveguide core 3 by providing a current to each segment, although the refractive-index of each segment is controlled by the temperature control in the embodiment. In this case, it is possible to achieve the refractive-index control by arranging electrodes instead of the thin film resistors 11. The temperature control in accordance with the embodiment is more effective, because a loss of light propagation is generated in the waveguide core 3 when a current is provided to the waveguide core 3. The laser portion 200 may have another CSG-DR area A instead of the SG-DR area C. In this case, it is possible to obtain more stable laser emission by matching each of optical longitudinal modes within the wavelength range where the peak reflection intensity of the optical longitudinal mode is relatively high of each CSG-DR area A.

The optical length of each segment may be determined by another arrangement or method, although the optical length of each segment is determined based on the length of the space areas. For example, the optical length of each segment may be determined based on materials of the space areas or the segments. In addition, it is possible to control the refractive-index of each segment based on the change amount of temperature of each segment (temperature gradient) and the absolute value of temperature of each segment (average temperature), because it is possible to control the refractive-index of each segment based on the temperature of that.

The wavelengths of the optical longitudinal modes may be controlled as well as the maximum intensity of the optical longitudinal modes when required, although the laser emission wavelength is controlled by keeping the wavelengths of the optical longitudinal modes constant and changing the maximum intensity of the optical longitudinal modes. In this case, the temperature of each segment may be controlled so that the average temperature of the segments is different from that before the temperature control. It is possible to control the wavelengths of the optical longitudinal modes as well as the intensity of those when the average temperature of each segment is controlled to be a temperature at which the desirable optical longitudinal mode wavelengths are obtained, because the optical longitudinal modes are changeable in the condition.

In the embodiments, the sampled diffractive grating 2 corresponds to the diffractive grating. The area having the sampled diffractive grating in the waveguide core corresponds to the first area. The space area corresponds to the second area. The waveguide core 3 corresponds to the first diffractive grating area. The waveguide core 4 corresponds to the gain area. The waveguide core 5 corresponds to the second diffractive grating area. The thin film resistor 11 corresponds to the heater. The laser portion 200 corresponds to the semiconductor laser or the optical element.

Second Embodiment

Next, a description will be given of a laser device 100a in accordance with a second embodiment of the invention. The laser device 100a has a laser portion 200a instead of the laser portion 200, being different from the laser device 100 shown in FIG. 1. A description will be given of the laser portion 200a.

Figure 7:
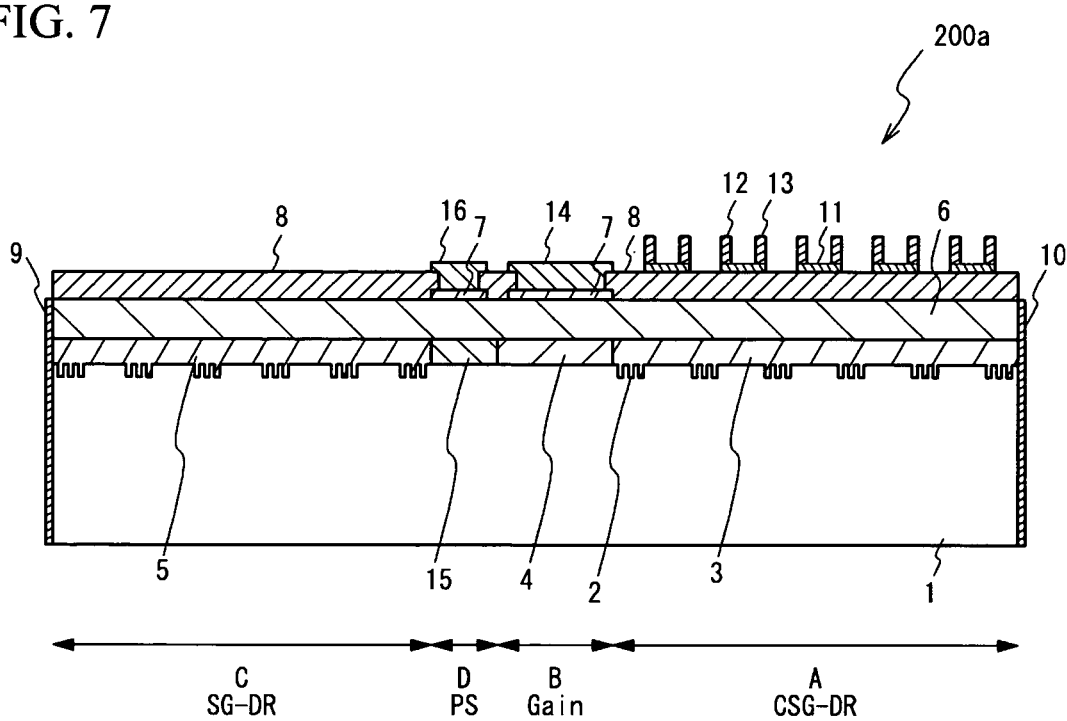
FIG. 7 illustrates a schematic cross sectional view of the laser portion in accordance with a second embodiment.

FIG. 7 illustrates a schematic cross sectional view of the laser portion 200a. The laser portion 200a has a Phase Shift (PS) area D between the Gain area B and the SG-DR area C, being different from the laser portion 200. The PS area D has a structure in which a waveguide core 15, the cladding layer 6, the contact layer 7 and an electrode 16 are laminated on the substrate 1.

The substrate 1 and the cladding layer 6 of the CSG-DR area A, the Gain area B, the PS area D and the SG-DR area C are formed as a unit respectively. The waveguide cores 3, 4, 5 and 15 are formed on a same plane and form one waveguide core together. The insulating layer 8 is also formed between the electrode 14 and the electrode 16. The waveguide core 15 is composed of InGaAsP crystalline having an absorption edge wavelength at shorter wavelengths side relative to the laser emission wavelength, as well as the waveguide core 3. The waveguide core 15 may be composed of the same material as the waveguide core 3 in the CSG-DR area A. The electrode 16 is an electrode to provide a current to the PS area D, and is composed of a conductive material such as Au.

The PS area D adjusts a phase in the waveguide core 15 based on the current provided to the electrode 16 so that a phase of a light at the desirable wavelength reflected by the waveguide core 3 corresponds to that reflected by the waveguide core 5. It is, therefore, possible to obtain a stable laser emission at the desirable wavelength from the laser portion 200a. In the embodiment, the PS area D corresponds to the phase adjusting area. The laser portion 200a corresponds to the semiconductor laser or the optical element.

Third Embodiment

Next, a description will be given of a laser device 100b in accordance with a third embodiment. The laser device 100b has a laser portion 200b instead of the laser portion 200, being different from the laser device 100 shown in FIG. 1. A description will be given of the laser portion 200b.

Figure 8A:
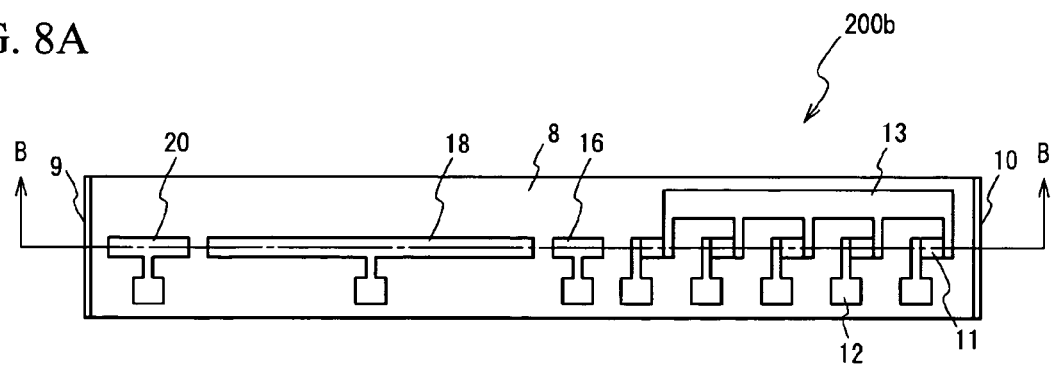
FIG. 8A and FIG. 8B illustrate a detail of the laser portion in accordance with a third embodiment.
Figure 8B:
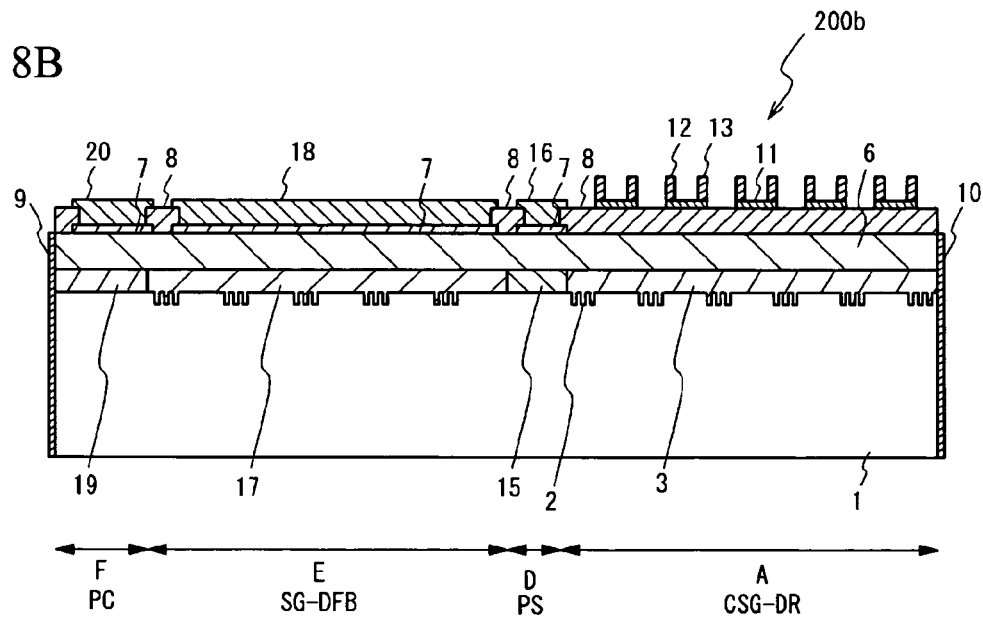

FIG. 8A and FIG. 8B illustrate a detail of the laser portion 200b. FIG. 8A illustrates a top view of the laser portion 200b. FIG. 8B illustrates a cross sectional view taken along a line B-B of FIG. 8A. A description will be given, with reference to FIG. 8A and FIG. 8B, of the laser portion 200b. The laser portion 200b has the PS area D, a SG-DFB area E and a Power Control (PC) area F instead of the Gain area B and the SG-DR area C.

The laser portion 200b has a structure in which the CSG-DR area A, the PS area D, the SG-DFB area E and the PC area F are coupled in order. The SG-DFB area E has a structure in which a waveguide core 17, the cladding layer 6, the contact layer 7 and an electrode 18 are laminated on the substrate 1 in order. The PC area F has a structure in which a waveguide core 19, the cladding layer 6, the contact layer 7 and an electrode 20 are laminated on the substrate 1 in order. The low reflecting coating 9 is formed on end faces of the substrate 1, the waveguide core 19 and the cladding layer 6 at the PC area F side.

The substrate 1 and the cladding layer 6 of the CSG-DR area A, PS area D, the SG-DFB area E and the PC area F are formed as a unit respectively. The waveguide cores 3, 15, 17 and 19 are formed on a same plane and form one waveguide core together. The insulating layer 8 is also formed between the electrode 16 and the electrode 18 and between the electrode 18 and the electrode 20. The sampled diffractive gratings 2 are formed in the waveguide core 17 at a given interval. The sampled grating is thus formed.

The waveguide core 17 is, for example, composed of InGaAsP crystalline amplifying an emitted laser of a desirable wavelength. The PL wavelength of the waveguide core 17 is approximately 1.57 μm. The number of the segments in the waveguide core 17 is preferably as same as that of the waveguide core 3, and is, for example, 5. Each length of the segments in the waveguide core 17 is substantially equal to each other, and is, for example, 240 μm. The waveguide core 19 is composed of InGaAsP crystalline to change an output of an outgoing light. The PL wavelength of the waveguide core 19 is approximately 1.57 μm.

Next, a description will be given of operation of the laser portion 200b. At first, a given current is provided to the electrode 18 from the controller 300 in FIG. 1. And a light is generated in the waveguide core 17. The light is amplified in the waveguide core 19, propagates in the waveguide cores 3, 15, 17 and 19, is reflected and amplified repeatedly and is emitted toward outside. A given current is provided to the electrode 20 from the controller 300. And the output of the outgoing light is kept constant.

The PL wavelengths of the waveguide cores 17 and 19 may be different from each other, although being equal to each other in the embodiment. However, it is possible to form the waveguide cores 17 and 19 in a same process, when the PL wavelengths of the waveguide cores 17 and 19 are equal to each other. In this case, the manufacturing cost is reduced. It is thus easy to manufacture the laser device 100b.

When an absorbing layer having an absorption edge wavelength at shorter wavelengths side relative to the laser emission wavelength is used as the waveguide core 19, it is possible to enhance the loss of laser light propagation by providing a current to the absorbing layer. It is, therefore, possible to control the intensity of the outgoing light emitted from an end face. In this case, a reflectivity toward a segment closest to the end face of the waveguide core 17 is under −30 dB by generating a propagation loss of −3 dB of one way in the absorbing layer, even if the reflectivity of the low reflecting coating 9 is approximately 0.3%. And it is possible to stabilize the mode of the laser emission. This effect is obtained when the waveguide core 17 is arranged to be inclined to the crystal axis. It is not necessary to change the current supply to the waveguide core 17, when the control of the intensity of the outgoing light is used. It is, therefore, possible to restrain the change of the refraction-index of the waveguide core 17. And it is possible to restrain the stability degradation of the laser emission being dependent on the refraction-index change of the waveguide core 17.

In the embodiment, the waveguide core 17 corresponds to the second diffractive grating area. The waveguide core 19 corresponds to the light absorption area or the light amplification area. The laser portion 200b corresponds to the semiconductor laser or the optical element.

Fourth Embodiment

Figure 9:
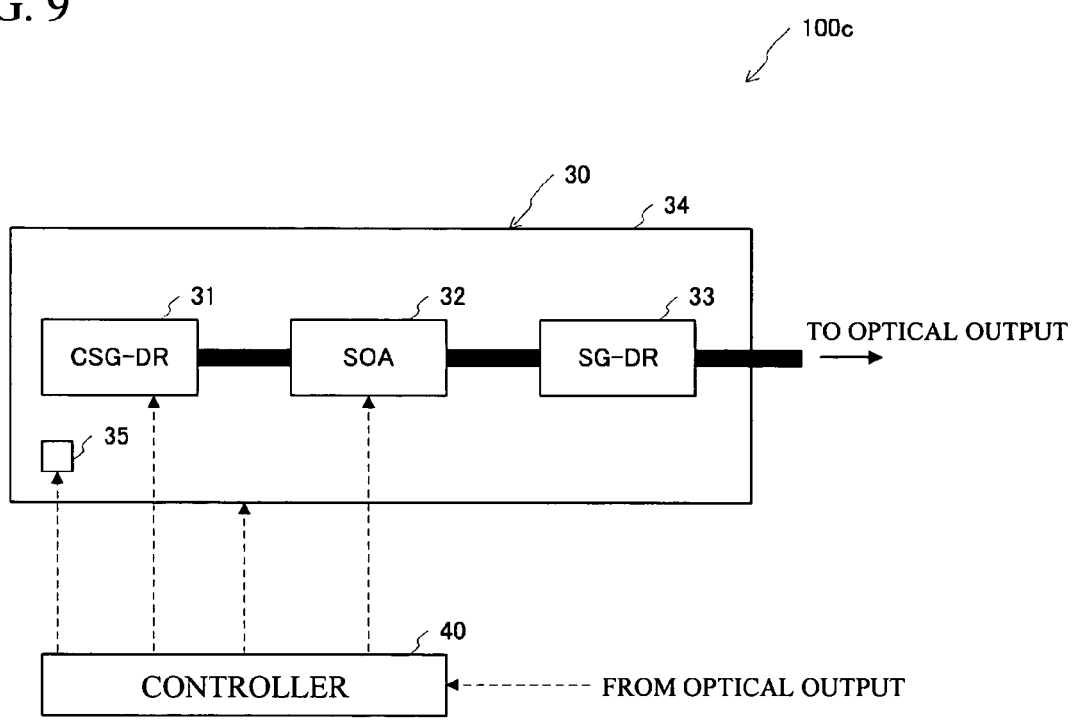
FIG. 9 illustrates an entire structure of the laser device in accordance with a fourth embodiment.

Next, a description will be given of a laser device 100c in accordance with a fourth embodiment. FIG. 9 illustrates an entire structure of the laser device 100c. As shown in FIG. 9, the laser device 100c has a laser module 30 and a controller 40. The laser module 30 has an optical element 31, a light amplification portion 32, an optical element 33, a temperature control device 34 and a thermistor 35. The optical element 31, the light amplification portion 32 and the optical element 33 are arranged on the temperature control device so as to form an optical axis.

The optical element 31 is an optical element having the CSG-DR area A mentioned above. The optical element 33 is an optical element having the SG-DR area C mentioned above. The light amplification portion 32 receives an instruction from the controller 40, amplifies an input light having a given effective wavelength range, and outputs a laser light. The laser light output from the amplification portion 32 propagates in the optical elements 31 and 33 and the light amplification portion 32, is reflected and amplified repeatedly and is emitted toward outside. The thermistor 35 detects the temperature of the temperature control device 34 and provides the detected result to the controller 40. In addition, a detection result of the optical output from outside is provided to the controller 40. The controller 40 controls the temperature of the temperature control device 34, the temperature of each segment of the CSG-DR area A in the optical element 31, and the light amplification portion 32, based on the detection result of the thermistor 35 and the detection result of the optical output from outside.

Figure 10:
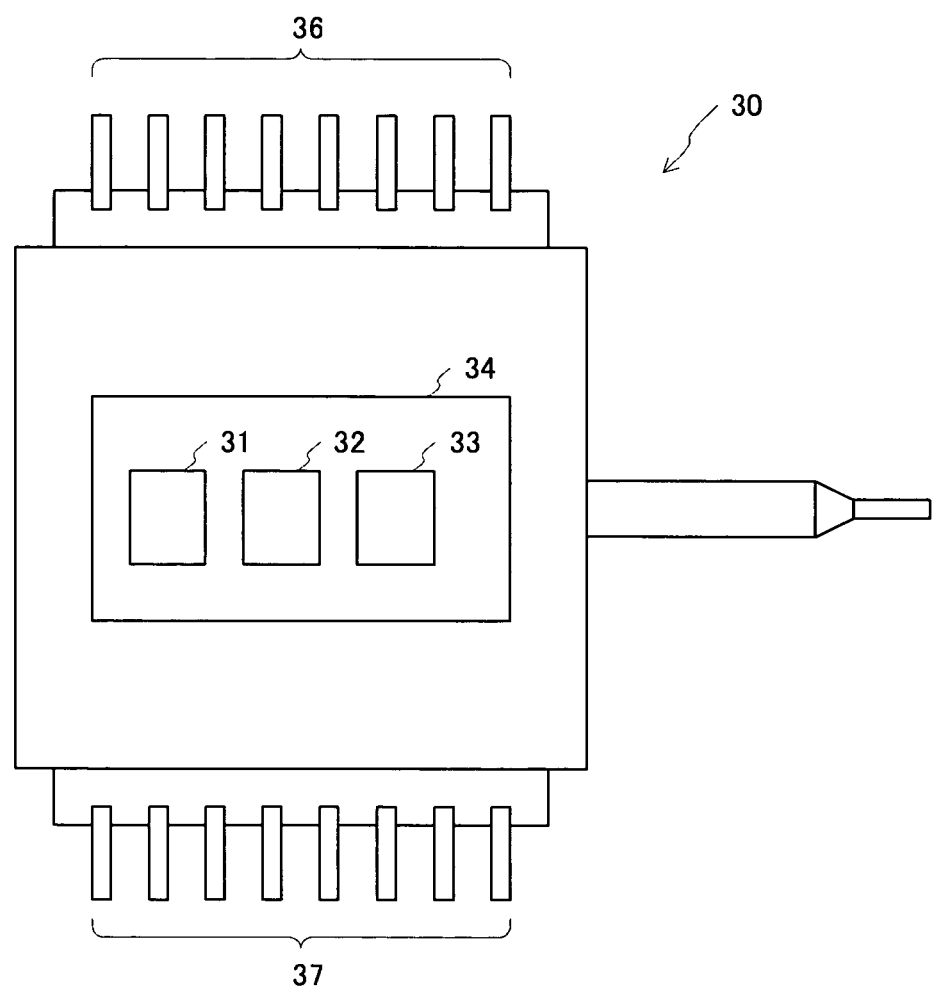
FIG. 10 illustrates a detail view of the laser module in accordance with the fourth embodiment.
Figure 11:
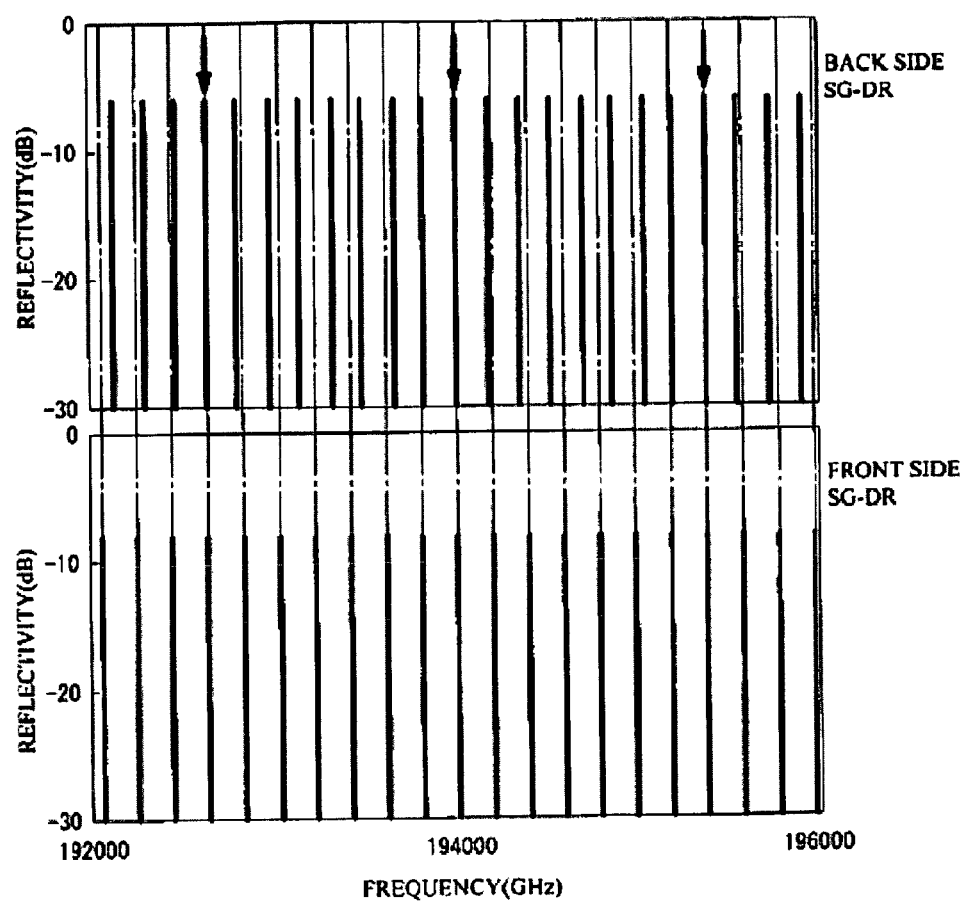
FIG. 11 illustrates a calculation example of reflection spectrums of two SG-DR waveguides when the intervals of the optical longitudinal modes of two SG-DR waveguides are respectively 194 GHz and 170 GHz.
Figure 12:
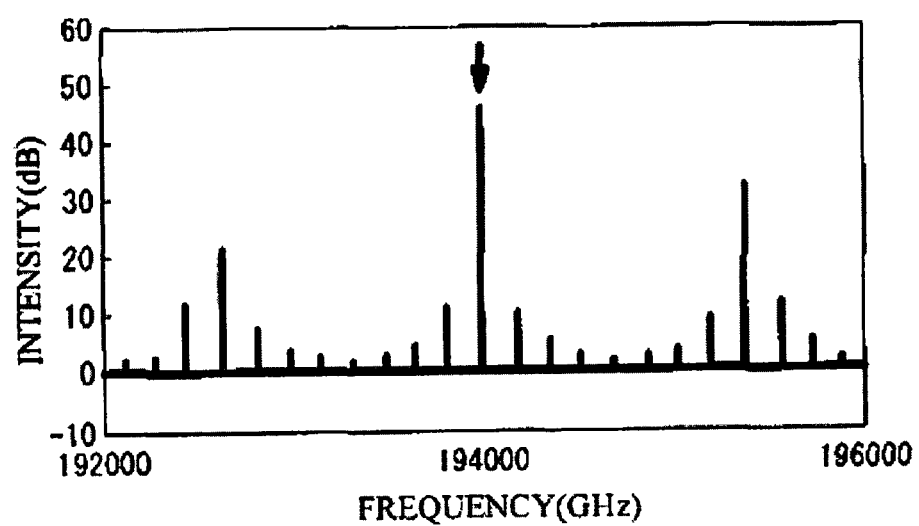
FIG. 12 illustrates an emission spectrum at threshold of laser emission calculated by a computer simulation for threshold by using the wavelength changeable semiconductor laser having two SG-DR waveguides shown in FIG. 11.

FIG. 10 illustrates a detail view of the laser module 30. As shown in FIG. 10, the laser module 30 has terminals 36 for inputting a signal from the controller 40 and terminals 37 for outputting a signal from the thermistor 35. The terminals 36 include a terminal for controlling the temperature control device 34, a terminal for controlling the temperature of each segment of the CSG-DR area A in the optical element 31, and a terminal controlling the light amplification portion 32. The positions of the terminals 36 and the terminals 37 are not limited. It is not necessary to arrange the terminals 36 at opposite side of the terminals 37. The terminals 36 and the terminals 37 may be arranged at a same side. The terminal 37 may be arranged between the terminals 36.

A signal wiring for inputting from the controller or for outputting to the controller is downsized, when the optical elements are moduled. It is, therefore, possible to downsize the laser device. In addition, a laser module, in which the laser portion 200 in accordance with the first embodiment is moduled and terminals to be connected to the power electrode 12 and the electrode 14 are provided, may be structured. A laser module, in which the laser portion 200a in accordance with the second embodiment is moduled and terminals to be connected to the power electrode 12 and the electrodes 14 and 16 are provided, may be structure. A laser module, in which the laser portion 200b is moduled and terminals to be connected to the power electrode 12 and the electrodes 16, 18 and 20 are provided, may be structured.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2005-232697 filed on Aug. 11, 2005, the entire disclosure of which is hereby incorporated by reference.

What is claimed is:

1. A semiconductor laser comprising:
 a first diffractive grating area that has a plurality of segments;

a second diffractive grating area that has another plurality of segments; and a plurality of heaters controlling a refractive index of the segments of the first diffractive grating area, wherein the plurality of segments of said first diffractive grating area includes one segment and other segments, the one segment being positioned at an edge of the first diffractive grating area that is closest to the second diffractive grating area, wherein each of the plurality of segments of said first diffractive grating area has a first area including a diffractive grating and a second area that is a space area adjacent the first area, optical lengths of at least two of the second areas of the other segments being different from each other, and a refractive index of the other segments being changeable by the plurality of heaters, the plurality of heaters being provided above the segments, wherein each of the another plurality of segments of said second diffractive grating area has another first area including another diffractive grating and another second area that is another space area adjacent the another first area, and optical lengths of all of the another second areas being substantially equal to each other, and wherein a length of the first area is shorter than a length of the second area.

2. The semiconductor laser as claimed in claim 1, wherein a minimum difference between the optical lengths of the second areas is within 1 to 6% of an average optical length of the second areas in the first diffractive grating area.

3. The semiconductor laser as claimed in claim 1, wherein minimum differences of the optical lengths between each of the second areas of the first diffractive grating area are equal to each other.

4. The semiconductor laser as claimed in claim 1, wherein the segments of the first diffractive grating area are arranged in an ascending order or a descending order of optical length.

5. The semiconductor laser as claimed in claim 1, wherein a light absorption area or a light amplification area is provided at an end face of the semiconductor laser.

6. The semiconductor laser as claimed in claim 1 further comprising a phase control area controlling a phase of a light in the first diffractive grating area and the second diffractive grating area.

7. The semiconductor laser as claimed in claim 1, wherein the diffractive grating in each of the plurality of segments of said first diffractive grating area has a bragg wavelength.

8. A semiconductor laser comprising:

a chirped sampled grating area that has a plurality of segments;

a sampled grating area that has another plurality of segments; and a plurality of heaters controlling a refractive index of the segments of the chirped sampled grating area, wherein each of the segments in the chirped sampled grating and the sampled grating area has a diffractive grating and space area adjacent the diffractive grating, wherein the plurality of segments of said chirped sampled grating area includes one segment and other segments, the one segment being positioned at an edge of the chirped sampled grating area that is closest to the sampled grating area, wherein the diffractive grating in the one segment of the chirped sampled grating area has a bragg wavelength, wherein the diffractive grating in the other segments of the chirped sampled grating area has the bragg wavelength, optical lengths of at least two of the space area of the other segments being different from each other, and a refractive index of the other segments being changeable by a plurality of heaters, the plurality of heaters being provided above the segments, and wherein a length of the first area is shorter than a length of the second area.

* * * * *